(12) United States Patent
Van Veen et al.

(10) Patent No.: US 8,847,386 B2
(45) Date of Patent: Sep. 30, 2014

(54) ELECTRICAL CONTACT FOR A CADMIUM TELLURIUM COMPONENT

(75) Inventors: Nicolaas Johannes Anthonius Van Veen, Geldrop (NL); Rob Van Asselt, Valkenswaard (NL); Gerard Kums, Molenstede (BE)

(73) Assignee: Koninklijke Philips N.V., Eindhoven (NL)

( * ) Notice: Subject to any disclaimer, the term of this patent is extended or adjusted under 35 U.S.C. 154(b) by 1210 days.

(21) Appl. No.: 12/666,817

(22) PCT Filed: Jun. 23, 2008

(86) PCT No.: PCT/IB2008/052479
§ 371 (c)(1),
(2), (4) Date: Dec. 28, 2009

(87) PCT Pub. No.: WO2009/004522
PCT Pub. Date: Jan. 8, 2009

(65) Prior Publication Data
US 2010/0184341 A1    Jul. 22, 2010

(30) Foreign Application Priority Data
Jun. 29, 2007    (EP) .................................... 07111421

(51) Int. Cl.
*H01L 23/48*    (2006.01)
*G01T 1/24*    (2006.01)
*H01H 1/021*    (2006.01)

(52) U.S. Cl.
CPC ..................................... *H01H 1/021* (2013.01)
USPC ............. 257/734; 257/42; 257/736; 257/737; 257/E23.021; 250/370.01; 250/370.09; 250/370.13

(58) Field of Classification Search
USPC .......... 257/737, E23.021, E23.069, 738, 778, 257/42, 734, 736; 438/612–617; 250/338.4, 250/442, 614, 370.01, 370.09, 370.13
See application file for complete search history.

(56) References Cited

U.S. PATENT DOCUMENTS 3,225,273 A  * 12/1965 Bakker et al. .................. 257/742
4,215,577 A  *  8/1980 Griffing et al. .................. 257/76
4,369,458 A  *  1/1983 Thomas et al. ................ 257/226
(Continued)

FOREIGN PATENT DOCUMENTS

CN             1203695 A    12/1998
GB             1014901 A    12/1965
(Continued)

OTHER PUBLICATIONS

Clayton et al: "Assembly Technique for a Fine-Pitch, Low-Noise Interface; Joining a CdZnTe Pixel-Array Detector and Custom VLSI Chip With AU Stud Bumps and Conductive Epoxy"; Nuclear Science Symposium Conference Record, IEEE 2003, vol. 5, pp. 3513-3517.

(Continued)

Primary Examiner — Jasmine Clark

(57) ABSTRACT

An electrical contact for a detector, the electrical component, comprising a cadmium tellurium component, a first layer formed onto the cadmium tellurium component, wherein the first layer comprises indium and a contact agent being bonded directly or indirectly to the first layer to be in electrical contact with the first layer. The contact agent may be a stud bump or a conductive adhesive interconnect being bonded indirectly to the first layer via noble metal shielding layer.

23 Claims, 6 Drawing Sheets

(56) References Cited

U.S. PATENT DOCUMENTS

| | | | |
|---|---|---|---|
| 4,633,050 A * | 12/1986 | Samuels | 200/268 |
| 4,785,137 A * | 11/1988 | Samuels | 174/559 |
| 4,972,244 A * | 11/1990 | Buffet et al. | 257/442 |
| 6,064,114 A * | 5/2000 | Higgins, III | 257/698 |
| 6,215,123 B1 * | 4/2001 | Orava et al. | 250/370.13 |
| 6,410,922 B1 * | 6/2002 | Spartiotis et al. | 250/370.09 |
| 6,524,966 B1 | 2/2003 | Wright et al. | |
| 7,223,982 B1 | 5/2007 | Chen et al. | |
| RE43,948 E * | 1/2013 | Puhakka et al. | 438/98 |
| 2002/0081760 A1 | 6/2002 | Whatmore | |
| 2002/0158207 A1 | 10/2002 | Spartiotis et al. | |
| 2004/0016913 A1 | 1/2004 | Sognefest et al. | |
| 2005/0118527 A1 | 6/2005 | Harel et al. | |

FOREIGN PATENT DOCUMENTS

| | | |
|---|---|---|
| GB | 1224171 A | 3/1971 |
| JP | 63268278 A1 | 11/1988 |
| WO | 9720342 A1 | 6/1997 |

OTHER PUBLICATIONS

Takahashi et al: "High Resolution CdTe Detector and Applications to Imaging Devices"; IEEE Transactions Nuclear Science, vol. 48, 2001, pp. 287-291.

* cited by examiner

ELECTRICAL CONTACT FOR A CADMIUM TELLURIUM COMPONENT

FIELD OF THE INVENTION

The present invention relates to an electrical contact for a cadmium tellurium component, and in particular to an electrical contact for a cadmium zinc tellurium component used in, for example, X-ray detectors for medical diagnostics for providing a more stable electrical contact.

BACKGROUND OF THE INVENTION

Direct conversion detectors are promising for medical imaging applications, like SPECT, CT and X-ray imaging. One of the most promising direct conversion materials available at this moment is an alloy of cadmium, zinc and tellurium (CZT). If CZT will make it to a commercial detection system depends on performance, price and reliability. The good performance of CZT is known and has been demonstrated. However, cost of CZT detectors is high and good reliability on longer term has not been demonstrated yet.

According to a standard methodology, there are provided well defined indium contacts on a cadmium tellurium or a cadmium zinc tellurium made by evaporation, wherein indium serves as well as anode material and adheres well to the cadmium tellurium. An electrical contact to the cadmium tellurium or a cadmium zinc tellurium is then made by conductive adhesive printed on a printed circuit board. However, this may lead to an unreliable contact between the conductive adhesive and the indium surface, so that reliability problems may occur due to ingress of humidity and subsequent oxidation or hydroxylation of the indium surface. This may lead to degraded functional performance, for example caused by higher contact resistances.

Electrical contacts to a cadmium tellurium (CdTe) component, in particular to a cadmium zinc tellurium component, which are used in, for example, X-ray detectors for medical diagnostics, are nowadays formed on an indium layer or bond pad because of the stable resistive contact. The electrical contact to the indium bond pad usually is formed with a conductive adhesive joint. The alternative of soldering results often in a rapid dissolution of the indium layer. Takahashi et al, 'High Resolution CdTe Detector and Applications to Imaging Devices', IEEE Transactions on Nuclear Science, 48, Pages 287-291, 2001, describes a combination of soft metal, gold and indium as a stud to prevent possible stress on the device. In order to obtain a good connection between the bond pad on the read out board and the pixel electrode on the CdTe wafer, a needle shaped stud consisting of two stages of gold studs is prepared on the bump pad. The studs are made from a gold stud bonder and a thin layer of indium is printed on the top of the stud to improve connectivity. The CdTe wafer and the fan out board are then pressed together.

However, such an arrangement may lead to a poorly defined anode structure. A pressure contact is difficult to control for large detector surfaces, so that a cadmium tellurium component is easily damaged by applying pressure. Further, it is difficult to control the amount of indium placed on top of the gold stud, leading to a questionable reliability and industrialization.

Various metals are used as contact electrodes for CT or CZT detectors, including platinum, gold and indium. Detectors with indium contacts connected to printed circuit boards using isotropic conductive adhesives (ICA) suffer from degradation. The presently manufactured CZT detectors contain indium contacts (both cathode and anode side). Packaging related problems with indium are the low melting temperature, the reactivity towards air, moist and other metals and the mobility. Change to other electrode materials is not trivial and is not expected in the next years.

Several of the problems can be overcome by selecting proper (mild) processes and materials, and functional detectors have been made by using low temperature curing carbon filled adhesives to connect the CZT to the PCB. However, it was observed that the electrical resistance of such contacts gradually increase in time, which shows that on longer term the reliability of such a system is not guaranteed.

SUMMARY OF THE INVENTION

It may be seen as an object of the present invention to provide an improved solution for an electrical contact for cadmium tellurium components leading, for example, to better performance and improved stability and reliability by a decreased oxidation and hydroxylation.

The object of the present invention is solved by the subject matter of the independent claims, wherein advantageous embodiments are incorporated in the dependent claims.

It should be noted that the following described exemplary embodiments of the invention apply also for the method and the device.

According to an exemplary embodiment of the invention, there is provided an electrical contact for a cadmium tellurium component comprising a cadmium tellurium component, a first layer formed onto the cadmium tellurium component, wherein the first layer comprises indium, and a contact agent being bonded directly or indirectly onto the first layer to be in electric contact with the first layer.

Thus, an oxidation or hydroxylation may be avoided, since the pedestal of the stud bump seals the underlying indium surface, so that a more reliable contact may be provided for contacting cadmium tellurium components. In addition or alternatively stable alloys or intermetallic compounds may be formed resulting in a more stable contact.

According to an exemplary embodiment of the invention, the cadmium tellurium component is a cadmium zinc tellurium component.

Cadmium zinc tellurium components are often used for X-ray detectors or gamma ray detectors, wherein the stud bumping on an indium surface may be also applied to a cadmium zinc tellurium component.

According to an exemplary embodiment of the invention, the first layer is designed as a bond pad.

This establishes a reliable contact between the indium layer and the cadmium tellurium component or the cadmium zinc tellurium component.

According to an exemplary embodiment of the invention, the first layer further includes nickel so as to form a nickel indium alloy.

The nickel provides a reliable property for a soldering process and further serves as an oxidation protection for the indium layer.

According to an exemplary embodiment of the invention, the contact agent is a stud bump.

A stud bump provides a simple and reliable possibility for contacting and at the same time covering the contact site for protection purposes of the contact site.

According to an exemplary embodiment of the invention, the stud bump comprises gold.

It should be noted that the stud bump, according to a further embodiment, may be made also from more or less pure gold in order to improve the manufacturing process. For the interconnection between the stud bump and the indium layer, it is required to use noble metal studs, wherein in practice gold provides a reliable and established property for the interconnection. Further, the contact between the stud bump and conductive adhesive is stable due to the noble metal content of the stud bump. It should be noted that also the conductive adhesive may comprise noble metal in order to provide a stable contact between the stud bump a conductive adhesive.

According to an exemplary embodiment of the invention, the stud bump is directly bonded onto the first layer.

Thus, the pedestal of the stud bump seals the underlying indium surface leading to a contact which is less sensitive to oxidation and hydroxylation.

According to an exemplary embodiment of the invention, the contact agent is a conductive adhesive.

Using a conductive adhesive may provide an efficient manufacturing process without the need for stud bumps. In this case the second and/or third layer may cover the first layer to prevent degradation of the first indium layer. As an example a conductive adhesive can be used on top of the second or third gold containing layer to make the electrical contact. Substantial improvement in the electrical stability of an isotropic conductive adhesive (ICA) on the electrode may be achieved by applying a gold layer on top of the indium. Between the indium an additional metal layer, such as nickel may be used as a diffusion barrier. An additional advantage of applying gold on top of indium is that a wider range of ICA materials can be used, which react with indium but are stable with gold electrodes.

According to an exemplary embodiment of the invention, the electrical contact further comprises a second layer, which second layer includes nickel, wherein the second layer covers at least a part of the first layer.

The second layer is not limited to nickel containing metals or alloys, but may also comprise or be made of for example gold.

According to a further embodiment, the second layer may also totally cover the first layer. Such a nickel layer provides a reliable layer for a soldering process and further may serve as an oxidation protection for the indium layer, in particular when the first layer does not include significant nickel parts.

According to an exemplary embodiment of the invention, the electrical contact further comprises a third layer, which third layer includes at least one out of a group consisting of gold and palladium, wherein the third layer covers directly or indirectly at least a part of the first layer.

It should be understood that when providing a third layer, the second layer may also partially or totally omitted.

According to an exemplary embodiment of the invention, the third layer may also cover at least a part of the second layer. The third layer serves as an oxidation protection for the first layer and second layer, respectively, wherein the gold or palladium component in the third layer provides a reliable surface for a soldering or a bonding process.

According to an exemplary embodiment of the invention, the stud bump is directly bonded onto the third layer.

Thus, the stud bump may be reliably contacted to the third layer, for example, by a bonding process or a soldering process. It should be noted that a further layer may be provided on top of the third layer, so that the second layer, the third layer and the further layer together may form a triple layer of the combination platinum, nickel, gold (PtNiAu) or gold, nickel, gold (AuNiAu), wherein in both cases the stud bump is bonded onto the gold layer.

According to an exemplary embodiment of the invention, the stud bump is bonded on to the most upper layer by ultrasonic wire bonding.

Ultrasonic wire bonding provides a reliable electric contact being also less sensitive to oxidation or hydroxylation. The energy and frequency are to be determined in order to arrive at the optimum parameters for the process.

According to an exemplary embodiment of the invention, the electrical contact further comprises a fourth layer, which fourth layer is made of at least one out of a group consisting of aluminium nitride and zinc sulphide, which fourth layer isolates the cadmium tellurium component from at least one out of a group consisting of the first layer and the second layer.

The fourth layer is open in the areas where the interconnect to one of the first to third layers has to be made.

The fourth layer therefore serves as a passivation layer for a better pixel division, which is important for pixel detectors to provide a sufficient contrast, without having an influencing effect of adjacent pixels.

According to an exemplary embodiment of the invention, a printed circuit board is mounted onto the stud bump by at least one out of a group consisting of a conductive adhesive, a non conductive adhesive and a solder of a low temperature soldering process.

Such a contact is stable and less sensitive against forces, moist and air being applied between the cadmium tellurium component or cadmium zinc tellurium component and a printed circuit board to be contacted to the cadmium tellurium component or the cadmium zinc tellurium component.

According to an exemplary embodiment of the invention, a printed circuit board is mounted onto the electrical contact via the conductive agent.

According to an exemplary embodiment of the invention, the printed circuit board comprises a bond pad, which bond pad is made of at least one out of a group consisting of copper and nickel gold, wherein the conductive adhesive or non conductive adhesive or the solder is applied on to the bond pad.

Providing a bond pad of copper or nickel gold provides a sufficient contact to the printed circuit board for both contact types, adhesive (conductive or non conductive) and solder.

According to an exemplary embodiment of the invention, there is provided an X-ray or gamma ray detector having an inventive electrical contact.

According to an exemplary embodiment of the invention, there is provided an infrared detector having an inventive electrical contact.

According to a further exemplary embodiment of the invention, there is provided a method of manufacturing an electrical contact for a cadmium tellurium component comprising providing a cadmium tellurium component, forming a first layer onto the cadmium tellurium component, wherein the first layer comprises indium, and bonding a contact agent directly or indirectly onto the first layer to be in electrical contact with the first layer.

Thus, a contact agent, e.g. a stud bump, for example, made of gold or comprising gold, or a conductive agent may be bonded onto an indium layer, which indium layer has been formed on a cadmium tellurium component, so that the electrical contact constitutes a reliable contact which is also less sensitive with respect to pressure applied between, for example, a printed circuit board and the cadmium tellurium component during the manufacturing process.

According to an exemplary embodiment of the invention, the cadmium tellurium component is a cadmium zinc tellurium component.

It should be noted that the above features also may be combined, wherein a combination of the above features may also lead to synergetic effects, which synergetic effects may extend over the sum of single effect of the corresponding features, even if the synergetic effects are not explicitly described in detail.

It may be seen as a gist of the present invention to provide a stud bump of a noble metal and/or a covering layer of a noble metal, in particular containing gold, or a conductive agent onto an indium surface, which indium surface is formed on a cadmium tellurium component, in particular a cadmium zinc tellurium component, in order to reduce the risk of performance degradation by oxidation or hydroxylation.

One of the ideas of the invention is to apply an inert metal such as gold on top of the indium electrodes. This metal has to be compatible with the bonding process used to attach the CZT to the board. In addition a diffusion barrier layer like nickel may be applied between the indium and the inert metal, to further increase the stability of the device. In the current invention description the interconnect process described is based on a contact agent, e.g. stud bumps or isotropic conductive adhesives, but the same is true for other interconnect processes, such as soldering and ACF processes. The advantage of the current invention is that the inert metals can be applied after detector manufacturing. Therefore, no changes in the indium electrode process are needed and the solution can be implemented on short term. Replacement of indium by a more inert metal electrode would require considerable time, because of production facilities adaptations and substantial development activities needed to develop new processes and evaluation of the impact on the functional properties of the device which are largely dependent on the CZT-metal interface.

These and other aspects of the present invention will become apparent from and elucidated with reference to the embodiments described hereinafter.

BRIEF DESCRIPTION OF THE DRAWINGS

Exemplary embodiments of the present invention will be described in the following with reference to the following drawings.

DETAILED DESCRIPTION OF THE EMBODIMENTS

Figure 1:
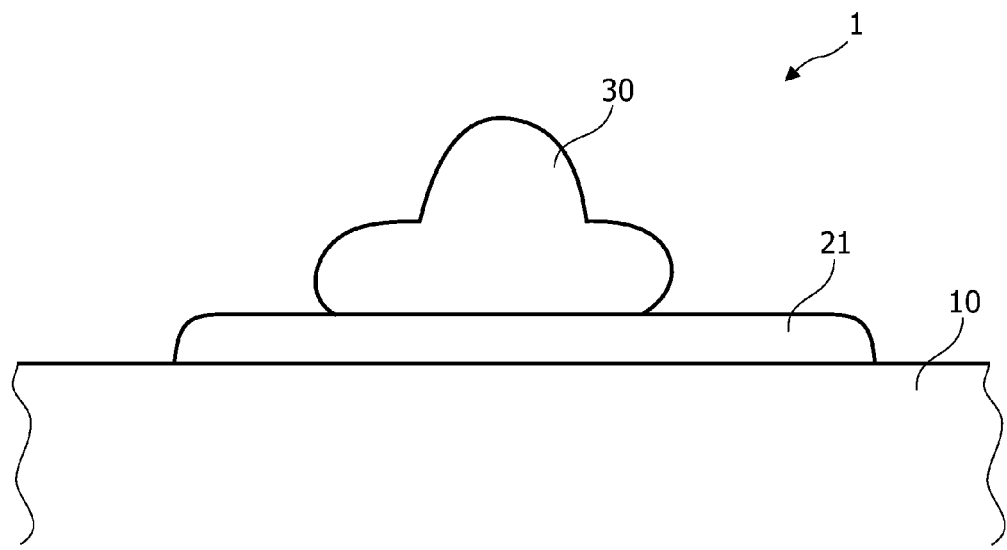
FIG. 1 illustrates a first embodiment of the present invention.

FIG. 1 illustrates an electrical contact 1 for a cadmium tellurium component 10 comprising a cadmium tellurium component 10, a first layer 21 formed onto the cadmium tellurium component 10. The first layer 21 comprises indium. A stud bump 30 is bonded onto the first layer 21 in order to form an electrical contact with the first layer 21. The stud bump 30 may comprise gold in order to provide a reliable protection against oxidation and hydroxylation. The stud bump may also be made of more or less pure gold. It should be noted that the stud bump instead of gold may comprise another noble metal, or may be made of another noble metal. The first layer 21 may comprise, for example, also nickel so as so form a nickel indium alloy, which nickel provides an improved protection against oxidation and hydroxylation and further serves as an improved base for a soldering or bonding process between the stud bump 30 and the first layer 21. The cadmium tellurium component 10 may also be a cadmium zinc tellurium component, which is often used for electrical contacts of X-ray or gamma ray detectors, as well as infrared detectors, in particular detectors being used in medical devices.

Stud bumping on indium is not trivial, since indium is a low melting metal with a very low modulus. For the interconnection between the stud bump and the first layer (or in general each layer onto which the stud bump 30 may be bonded) it is very useful to use noble metal studs, which in practice are often made of gold. However, if bonding is carried out with a standard gold wire bonding the temperature of the substrate will be about 150° C. At such a high temperature, the indium will melt and oxidize or diffuse into the cadmium tellurium component or in the stud bump metal, which will lead to an unbondable surface. However, if finding an acceptable process window for a bonding process based on a lower bonding temperature is desired, a reliable interconnection may be provided. This may be carried out for example on a lower ultrasonic energy, but at a higher ultrasonic frequency.

Figure 2:
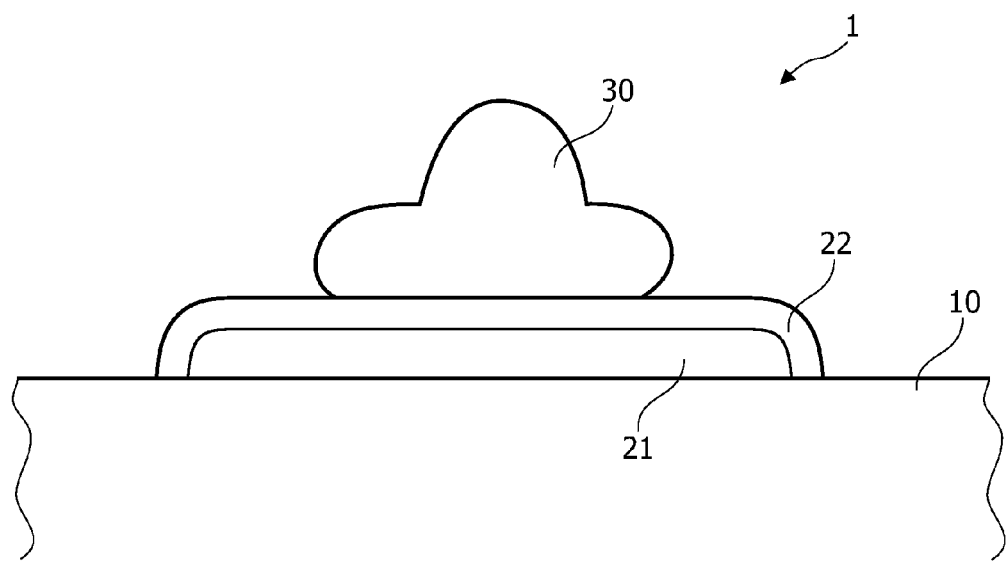
FIG. 2 illustrates a second embodiment of the present invention.

The provision of nickel in the first layer 21 or onto the first layer 21 as a separate second layer 22, as illustrated in FIG. 2, may lead to a more solid mechanical base for a stud bumping process. The application of the nickel layer may be done by, for example, co-sputtering or co-evaporation of nickel and indium respectively, so that either an alloy may be formed during this process or just a diffusion of the nickel into the indium may take place. However, when providing a co-sputtering or co-evaporation of nickel and indium, respectively, an improved stud bumping process will be the result. The second layer 22 may also comprise other metal than nickel, such as gold.

By forming the stud bump onto the cadmium tellurium component side via the first layer instead of the printed circuit board side, a kind of reversed structure may be provided which may be advantageous with respect to the oxidation and hydroxylation of the electrical contact.

FIG. 2 illustrates a second embodiment of the invention, according to which onto the first layer at least partially a second layer 22 is formed in order to provide a protection of the first layer 21. If covering the total first layer 21, a total protection over an oxidation or hydroxylation may be provided by the second layer 22. In this embodiment, the stud bump 30 is bonded onto the top surface of the second layer 22.

Figure 3:
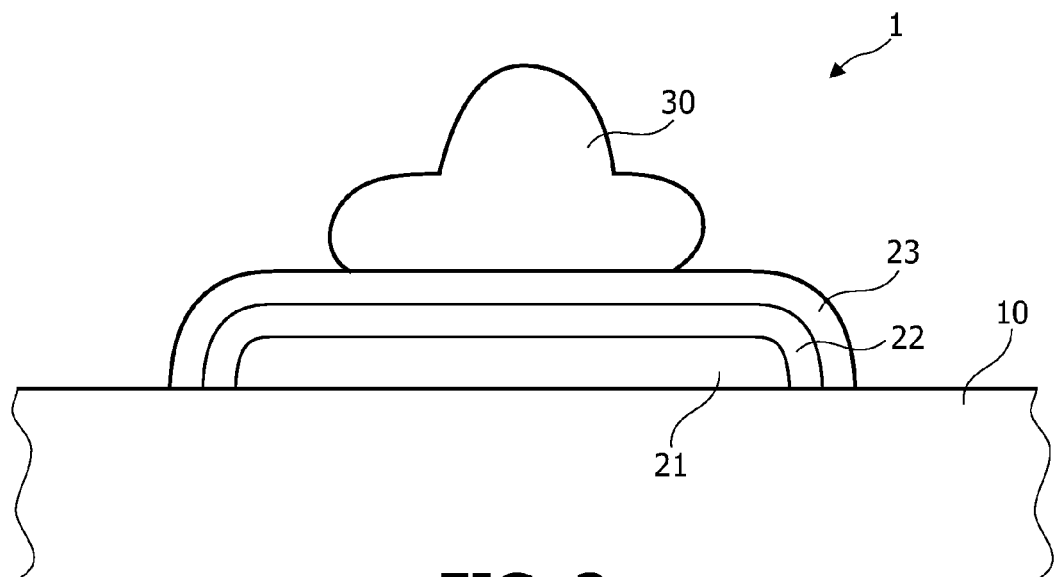
FIG. 3 illustrates a third embodiment of the present invention.

FIG. 3 illustrates a third embodiment of the invention, in which a third layer 23 is provided on top of the second layer 22. The third layer 23 may cover both the second layer 22 and the first layer 21 at least partially. If, for example, the second layer 22 covers only a part of the first layer 21, e.g. the centre part, the third layer 23 will, for example, cover the first layer 21 and the second layer 22. In this case a part of the first layer may be covered directly, wherein a remaining part of the first layer may be covered indirectly owing to the intermediate second layer 22 onto the central part of the first layer 21. It should be noted that the latter described embodiment is not illustrated in any of the Figs.

The third layer may comprise gold or may comprise palladium. Au and Pd are used for the enhancement/conservation of the wire bondability of the surface. For some practical cases the third layer may cover a second "barrier" layer, which chemically and mechanically may separate the first layer from the third layer.

Figure 4:
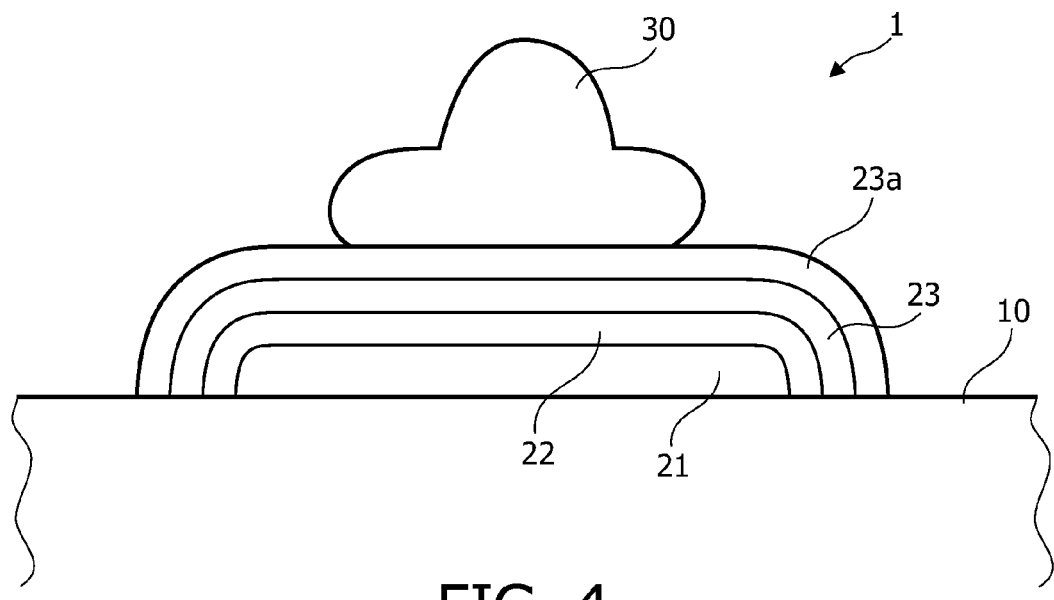
FIG. 4 illustrates a fourth embodiment of the present invention.

FIG. 4 illustrates a fourth embodiment of the present invention, according to which a further layer 23a may be formed on the third layer 23 (partially or totally). The second layer 22, the third layer 23 and the further layer 23a may provide a layer structure in the sequence from bottom to top of platinum, nickel, gold (PtNiAu) or gold, nickel, gold (AuNiAu). Thus, the second layer may be formed, for example, also by platinum or gold, wherein the third layer may be formed of nickel, and the further layer 23a may be formed of gold.

The stud bump 30 may be directly bonded onto the third layer, as illustrated in FIG. 3 or in general may be bonded onto the most upper layer 21, 22, 23, 23a, as illustrated in FIGS. 1, 2, 3 and 4. The bonding of the stud bump 30 may be carried out by an ultrasonic wire bonding. This ultrasonic wire bonding may be carried out, compared to a standard method, with a lower ultrasonic energy, but at a higher ultrasonic frequency.

Figure 5:
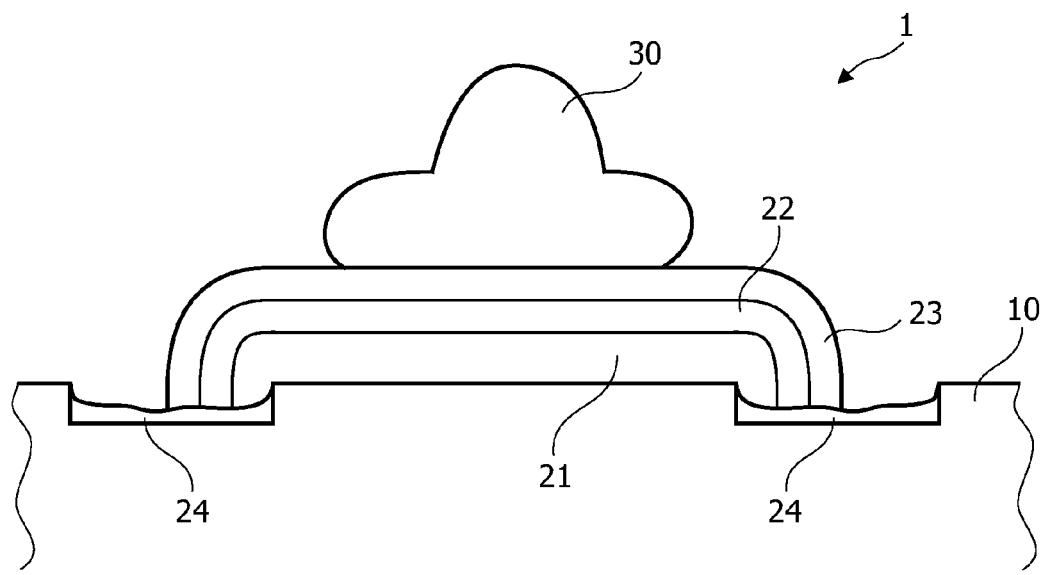
FIG. 5 illustrates a fifth embodiment of the present invention.

FIG. 5 illustrates a fifth embodiment of the invention, in which the electrical contact comprises a fourth layer 24, which fourth layer is made of at least one out of a group consisting of aluminium nitride and zinc sulphide, which fourth layer isolates the cadmium tellurium component from at least one out of a group consisting of the first layer 21 and the second layer 22. The fourth layer may serve as a passivation in order to delimit adjacent pixels from each other. Aluminium nitride commonly is less hygroscopic than zinc sulphide. The purpose of the AlN or ZnS layer may also be to protect uncoated areas of the cadmium zinc tellurium or cadmium tellurium component from the environment.

It should be noted that the embodiment of FIG. 5 may also be modified in order to provide the fourth layer 24 solely with the first layer, or alternatively with the first layer and the second layer. Further, it should be noted that the fourth layer 24 may also be combined with the combination of the first layer 21, the second layer 22, the third layer 23 and the further layer 23a as illustrated in FIG. 4. In other words, the fourth layer 24 may be provided in combination with each of the embodiments shown in FIG. 1, FIG. 2, FIG. 3 and FIG. 4. In addition to the situation shown in FIG. 5, the fourth layer 24 may also be (partly) on top of one or more of the metal layers 21-23a.

Figure 6:
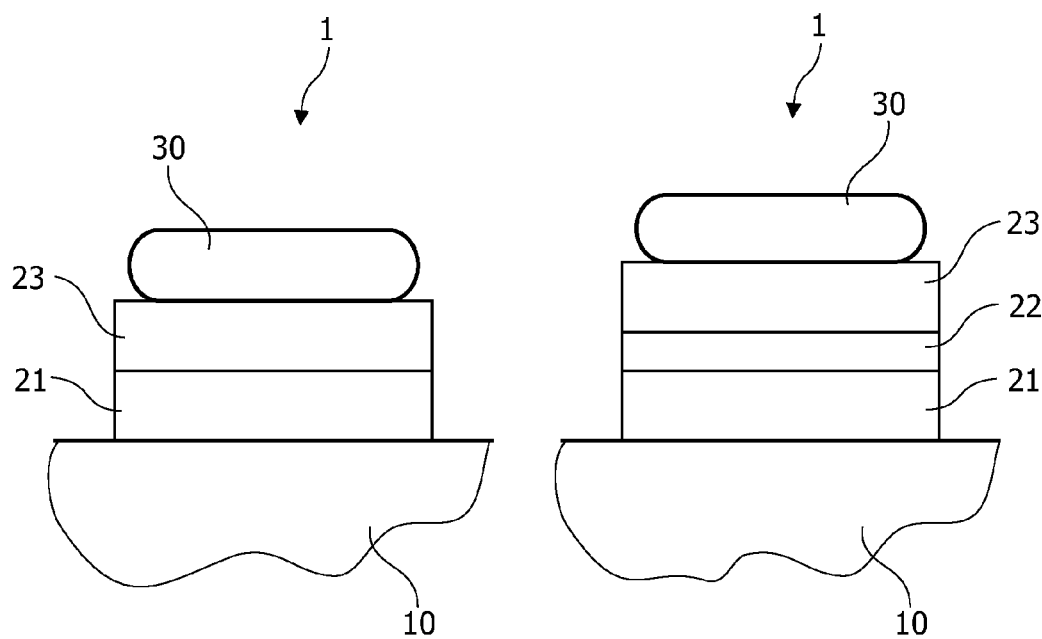
FIG. 6 illustrates a sixth embodiment of the present invention.

FIG. 6 illustrates a sixth embodiment of the invention, according to which onto the first layer at least partially a second layer 22 is formed in order to provide a protection of the first layer 21. On top of the second layer 22 there may be formed a third layer 23. The second layer 22 may also be omitted. In this embodiment, contact agent is formed by a conductive adhesive 30, which is bonded onto the top surface of the third layer 23. The conductive adhesive may be an Isotropic Conductive Adhesive (ICA), which may be an epoxy matrix filled with conductive particles (e.g. Au, Ag, Ni), which touch each other and form a conductive path. The third layer 23 may be provided on top of the second layer 22. The third layer 23 may cover both the second layer 22 and the first layer 21 at least partially. If, for example, the second layer 22 covers only a part of the first layer 21, e.g. the centre part, the third layer 23 will, for example, cover the first layer 21 and the second layer 22. In this case a part of the first layer may be covered directly, wherein a remaining part of the first layer may be covered indirectly owing to the intermediate second layer 22 onto the central part of the first layer 21. It should be noted that the latter described embodiment is not illustrated in any of the Figs.

Figure 7:
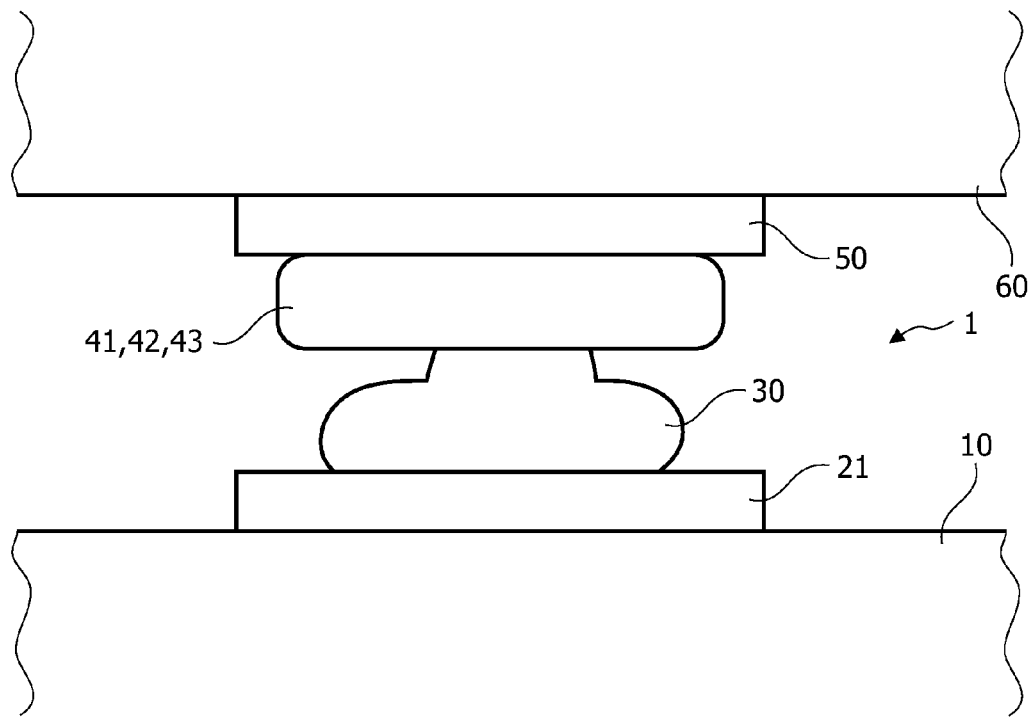
FIG. 7 illustrates an electrical contact arrangement according to an embodiment of the invention.

FIG. 7 illustrates an exemplary embodiment of the electrical contact, wherein the electrical contact is further provided with a printed circuit board 60 mounted onto the stud bump 30. As a further alternative, the printed circuit board 60 comprises a bond pad 50, via which bond pad, the circuit board 60 may be mounted onto the stud bump 30. The bond pad 50 may be of copper or nickel gold, however the bond pad 50 is not limited thereto. A connection between the bond pad 50 and the stud bump 30 may be provided by, for example, a soldering process. However, it is also possible to provide a conductive adhesive 41, a non-conductive adhesive 42 or the solder 43 of a low temperature soldering process in order to contact the bond pad 50 to the stud bump 30. The conductive adhesive 41 may comprise, for example, noble metal in order to provide the conductivity of the adhesive. The stud bumping process combined with conductive adhesives can be well industrialized and leaves an easy pressureless assembly process. It should be noted that a detector may have not only a single electrical contact as illustrated in the present application, but may also have a plurality of such electrical contacts.

Figure 8:
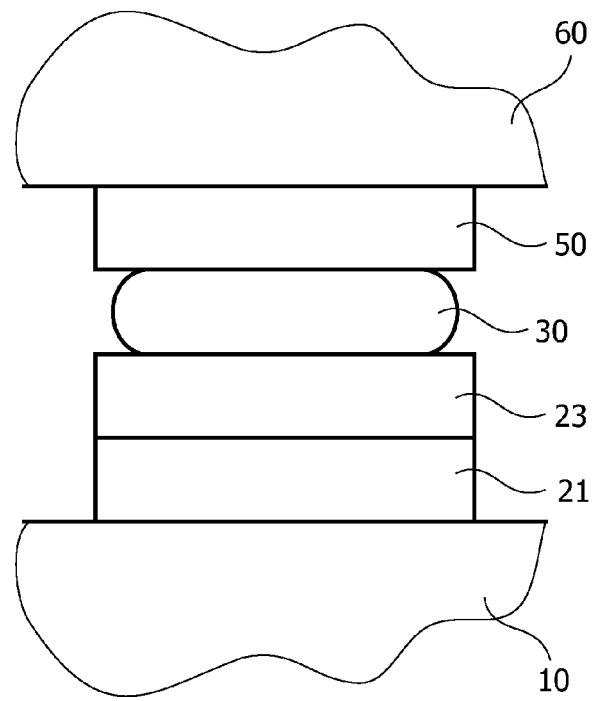
FIG. 8 illustrates an electrical contact arrangement according to a further embodiment of the invention.

FIG. 8 illustrates a further exemplary embodiment of the electrical contact, wherein the electrical contact is further provided with a printed circuit board 60 mounted onto the conductive adhesive, e.g. a ICA bump 30. As a further alternative, the printed circuit board 60 comprises a bond pad 50, via which bond pad, the circuit board 60 may be mounted onto the conductive adhesive 30. The bond pad 50 may be of copper or nickel gold, however is not limited thereto. The conductive adhesive 30 may comprise, for example, noble metal in order to provide the conductivity of the adhesive, as described above. The bumping process combined with conductive adhesives can be well industrialized and leaves an easy pressure-less assembly process. It should be noted that a detector may have not only a single electrical contact as illustrated in the present application, but may also have a plurality of such electrical contacts.

Carbon filled epoxy applied by dispense or printing have been used to connect the CZT with indium contacts without a further layer to the PCB. In a test device the electrical properties of these prior art contacts were monitored. The build up of the device and the electrical test results show that the resistance of the contacts increases in time and that even after 50 days at room temperature no stable situation has been reached. In the improved configuration of the present invention, prior to assembly a 200 nm gold layer had been sputtered on top of the indium contacts. In the next step contact to the PCB had been made using the same processes and materials as described above. As a result the resistance remains much more stable than in the absence of gold. In addition the resistance values are lower, which is also beneficial for the application. In this example gold was applied by sputtering, but other methods like evaporation, chemical vapour deposition (CVD) or electro-less deposition may also be used. The thickness of the gold chosen was 200 nm, but for proper coverage and bonding properties any thickness in the range 50-1000 nm may be used. As described above gold can be deposited directly on the indium, but to improve the stability in time further a diffusion barrier like nickel can be deposited between the indium and gold. Patterning of the gold top layer on the anode side may be needed.

In particular, the detector may be an X-ray or gamma ray detector having the above described electrical contacts. However, also an infrared detector may be provided with one or a plurality of electrical contacts according to the present invention.

Figure 9:
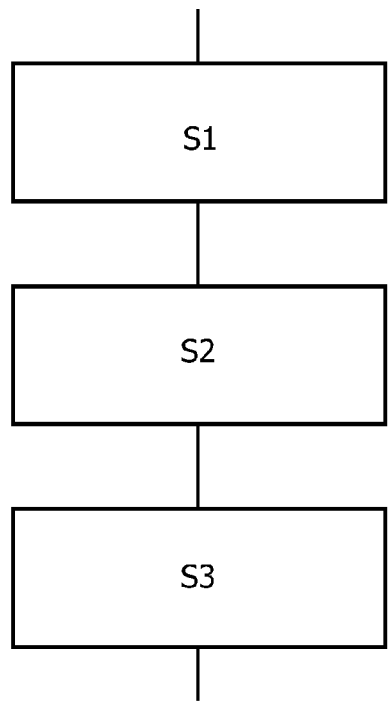
FIG. 9 illustrates a schematic flow chart of the method according to an embodiment of the invention.

FIG. 9 illustrates an embodiment of the method of manufacturing an electrical contact for a cadmium tellurium component, which method comprises providing S1 a cadmium tellurium component 10, forming S2 a first layer 21 onto the cadmium tellurium component 10, wherein the first layer 21 comprises indium, and bonding S3 a contact agent 30, e.g. a stud bump or a conductive agent, directly or indirectly onto the first layer 21 to be in electric contact with the first layer 21.

According to an embodiment of the invention, the cadmium tellurium component may be a cadmium zinc tellurium component.

Figure 10:
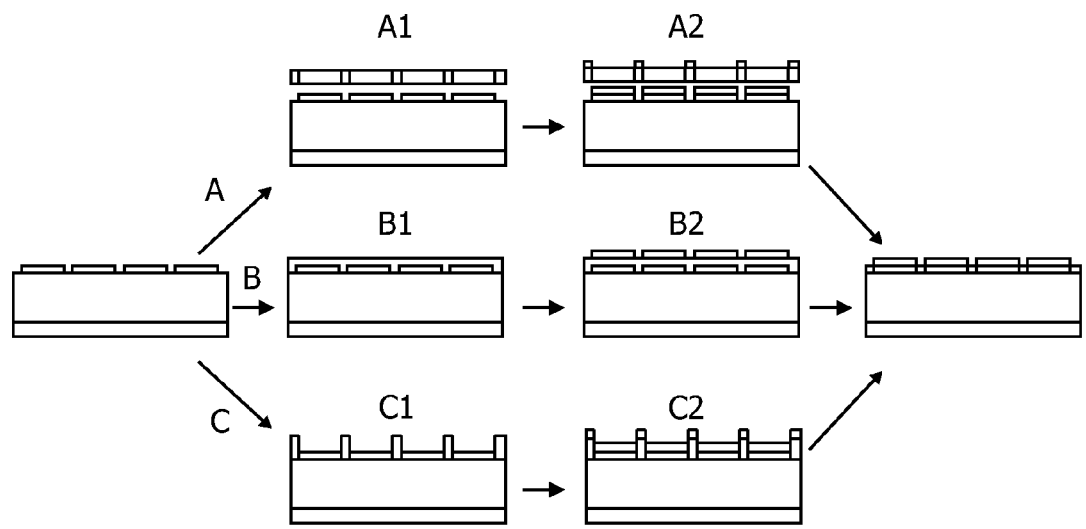
FIG. 10 illustrates an exemplary schematic process of the application procedure of a layer.

FIG. 10 illustrates an exemplary schematic process of the application procedure of a layer. A patterning of a gold top layer on the anode side is exemplarily described. This can be achieved be conventional processes, such as deposition through a shadow mask, litho and etching (wet or dry), or lift off processing. Options for the application of a patterned gold layer on top of indium are in option A a shadow mask process, in option B a litho and etching process and in option C a lift off process. In the shadow mask process a shadow mask is applied in step A1, then a gold deposition takes place. Afterwards, the shadow mask is removed in step A2. In the litho and etching process, gold is deposited in step B1, then a litho process takes place in step B2. Afterwards, an etch strip takes place. In the lift off process, a litho process takes place in step C1, then a gold deposition takes place in step C2. Afterwards a stripping takes place. The result of all three options A, B and C may be the same, at least similar.

Figure 11:
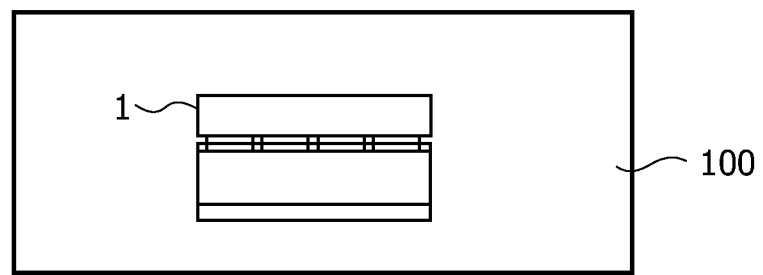
FIG. 11 illustrates a schematic block diagram of a detector.

FIG. 11 illustrates a block diagram of a detector 100 including electrical contacts 1 or one or a plurality of devices 1 according to the present invention. The detector 100 may be one out of a group comprising any imaging detector, including x-ray, gamma, PET, CT, or other medical imaging or non-medical imaging detectors, however is not limited thereto. The illustrated device 1 may also be a device according to another embodiment of the invention.

It should be noted that further method steps may be included, for example, providing further layers, as it is described with respect to the electrical contact device described above with respect to FIGS. 1-8. Thus, the method steps may be further specified with respect to the use of particular materials, as described above with respect to the electrical contact. In other words, the method may include further steps or further specified steps in analogy to the build up of the electrical contact, as described with respect to the above embodiments.

It should be noted that the device may also be applied to any imaging detector, including x-ray, gamma, PET, CT, or other medical imaging or non-medical imaging detectors.

It should be noted that the term 'comprising' does not exclude other elements or steps and the term 'a' or 'an' does not exclude a plurality. Also elements described in association with the different embodiments may be combined.

It should be noted that the reference signs in the claims shall not be construed as limiting the scope of the claims.

The invention claimed is:

1. Electrical contact for a detector, the electrical contact, comprising
    a cadmium tellurium component;
    a first layer formed onto the cadmium tellurium component, wherein the first layer comprises a nickel indium alloy;
    a contact agent bonded directly onto the first layer to be in electric contact with the first layer; and
    a second layer, which includes nickel, wherein the second layer covers at least a part of the first layer.

2. Electrical contact of claim 1, wherein the cadmium tellurium component is a cadmium zinc tellurium component.

3. Electrical contact of claim 1, wherein the first layer is designed as a bond pad.

4. Electrical contact of claim 1, wherein the contact agent is a conductive agent.

5. Electrical contact of claim 1, wherein the contact agent is a stud bump.

6. Electrical contact of claim 5, wherein the stud bump comprises gold.

7. Electrical contact of claim 5, wherein the stud bump is directly bonded onto the first layer.

8. Electrical contact of claim 1, further comprising a third layer, which third layer includes at least one out of a group consisting of gold and palladium, wherein the third layer covers directly or indirectly at least a part of the first layer.

9. Electrical contact of claim 8, wherein the third layer covers at least a part of the second layer.

10. Electrical contact of claim 8, wherein the contact agent is a stud bump directly bonded onto the third layer.

11. Electrical contact of claim 10, wherein the stud bump is bonded onto a most upper layer by ultra sonic wire bonding.

12. Electrical contact of claim 8, further comprising a fourth layer, which fourth layer is made of at least one out of a group consisting of aluminum nitride and zinc sulphide, which fourth layer isolates the cadmium tellurium component from at least one out of a group consisting of the first layer and the second layer.

13. Electrical contact of claim 10, wherein a printed circuit board is mounted onto the stud bump via at least one out of the group consisting of a conductive adhesive, a non-conductive adhesive and a solder of a low temperature soldering process.

14. Electrical contact of claim 1, wherein a printed circuit board is mounted onto the electrical contact via the contact agent.

15. Electrical contact of claim 13, wherein the printed circuit board comprises a bond pad, which bond pad is made of at least one out of a group consisting of copper and nickel gold, wherein the conductive adhesive or the non-conductive adhesive or the solder is applied onto the bond pad.

16. X-ray or gamma ray detector having an electrical contact of claim 1.

17. Infrared detector having an electrical contact of claim 1.

18. Method of manufacturing an electrical contact for a detector, the electrical contact, comprising
    providing a cadmium tellurium component;
    forming a first layer onto the cadmium tellurium component, wherein the first layer comprises a nickel indium alloy;
    bonding a contact agent directly or indirectly onto the first layer to be in electric contact with the first layer; and
    forming a second layer, which includes nickel, that covers at least a part of the first layer.

19. Method of claim 18, wherein the cadmium tellurium component is a cadmium zinc tellurium component.

20. An electrical contact for a detector, the electrical contact, comprising
    a cadmium tellurium component;
    a first layer formed onto the cadmium tellurium component, wherein the first layer comprises indium;
    a contact agent being bonded directly onto the first layer to be in electric contact with the first layer; and a second layer, which second layer includes nickel, wherein the second layer covers at least a part of the first layer.

21. An X-ray detector, comprising:
an electrical contact, comprising:
- a cadmium tellurium component,
- a first layer formed onto the cadmium tellurium component, wherein the first layer comprises indium; and
- a contact agent being bonded directly onto the first layer to be in electric contact with the first layer; and
- a second layer that covers at least a part of the first layer.

22. A gamma ray detector, comprising:
an electrical contact, comprising:
- a cadmium tellurium component,
- a first layer formed onto the cadmium tellurium component, wherein the first layer comprises indium; and
- a contact agent being bonded directly onto the first layer to be in electric contact with the first layer; and
- a second layer that covers at least a part of the first layer.

23. An infrared detector, comprising:
an electrical contact, comprising:
- a cadmium tellurium component,
- a first layer formed onto the cadmium tellurium component, wherein the first layer comprises indium; and
- a contact agent being bonded directly onto the first layer to be in electric contact with the first layer; and
- a second layer that covers at least a part of the first layer.

* * * * *